United States Patent
Kim et al.

(10) Patent No.: US 8,822,296 B2
(45) Date of Patent: Sep. 2, 2014

(54) USE OF PLATE OXIDE LAYERS TO INCREASE BULK OXIDE THICKNESS IN SEMICONDUCTOR DEVICES

(71) Applicant: Fairchild Semiconductor Corporation, San Jose, CA (US)

(72) Inventors: Sunglyong Kim, Falmouth, ME (US); Steven Leibiger, Falmouth, ME (US); Christopher Nassar, Portland, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 62 days.

(21) Appl. No.: 13/665,414

(22) Filed: Oct. 31, 2012

(65) Prior Publication Data

US 2014/0120694 A1     May 1, 2014

(51) Int. Cl.
*H01L 21/336*     (2006.01)

(52) U.S. Cl.
USPC .......................................................... 438/297

(58) Field of Classification Search
CPC ................................................ H01L 29/66515
USPC ......................................... 438/294, 297, 682
See application file for complete search history.

(56) References Cited

U.S. PATENT DOCUMENTS

| | | | |
|---|---|---|---|
| 7,824,999 B2 | 11/2010 | Leibiger et al. | |
| 2011/0092035 A1* | 4/2011 | Hu et al. | 438/250 |
| 2013/0056825 A1* | 3/2013 | Chen et al. | 257/344 |

* cited by examiner

*Primary Examiner* — Bradley K Smith
(74) *Attorney, Agent, or Firm* — Kenneth E. Horton; Kirton McConkie

(57) ABSTRACT

Semiconductor devices and methods for making such devices are described. The semiconductor devices are made by providing a semiconductor substrate with an active region, providing a bulk oxide layer in a non-active portion of the substrate, the bulk oxide layer having a first thickness in a protected area of the device, providing a plate oxide layer over the bulk oxide layer and over the substrate in the active region, forming a gate structure on the active region of the substrate, and forming a self-aligned silicide layer on a portion of the substrate and the gate structure, wherein the final thickness of the bulk oxide layer in the protected area after these processes remains substantially the same as the first thickness. The thickness of the bulk oxide layer can be increased without any additional processing steps or any additional processing cost. Other embodiments are described.

20 Claims, 4 Drawing Sheets

USE OF PLATE OXIDE LAYERS TO INCREASE BULK OXIDE THICKNESS IN SEMICONDUCTOR DEVICES

FIELD

This application relates generally to semiconductor devices and methods for making such devices. More specifically, this application describes semiconductor devices containing plate oxide layers that can be used to increase the bulk oxide thickness.

BACKGROUND

Semiconductor devices containing integrated circuits (ICs) or discrete devices are used in a wide variety of electronic apparatus. The IC devices (or chips, or discrete devices) comprise a miniaturized electronic circuit that has been manufactured in the surface of a substrate of semiconductor material. The circuits are composed of many overlapping layers, including layers containing dopants that can be diffused into the substrate (called diffusion layers) or ions that are implanted (implant layers) into the substrate. Other layers are conductors (polysilicon or metal layers) or connections between the conducting layers (via or contact layers). IC devices or discrete devices can be fabricated in a layer-by-layer process that uses a combination of many steps, including growing layers, imaging, deposition, etching, doping and cleaning. Silicon wafers are typically used as the substrate and photolithography is used to mark different areas of the substrate to be doped or to deposit and define polysilicon, insulators, or metal layers.

The localized oxidation of silicon (LOCOS) isolation method is used in many processes for manufacturing semiconductor integrated circuits. In LOCOS processing, active silicon areas on the surface of a silicon substrate (or epitaxial layer) can be electrically isolated by relatively thick insulating (or bulk) oxide regions. A patterned film of deposited silicon nitride can be used to selectively suppress oxide growth where an active silicon region is desired. Devices such as diodes, transistors, resistors, capacitors and other microelectronic structures are subsequently built in these active silicon regions between the insulating oxide regions.

As semiconductor device dimensions shrink in size and pitch, it becomes increasingly difficult to grow a thick and robust LOCOS oxide between closely spaced silicon regions. This is because the oxide layer thins as it approached the active silicon edge, forming the classic "bird's head" profile. Therefore, the full desired thickness may never be achieved if the active areas are so close that the opposing bird's heads intersect. Compounding this problem, after growth the field oxide is exposed to several subsequent processing steps that diminish its thickness, and further reduces its effectiveness as an ion implant blocking agent. These include the oxide etches associated with the oxide spacer formation and other processing steps. Their effect is shrinkage of all isolation oxide regions both laterally and vertically. The oxide between closely spaced active regions is affected proportionally more since it is thinner at the start.

SUMMARY

This application describes semiconductor devices and methods for making such devices. The methods include making a semiconductor device by providing a semiconductor substrate with an active region, providing a bulk oxide layer in a non-active portion of the substrate, the bulk oxide layer having a first thickness in a protected area of the device, providing a plate oxide layer over the bulk oxide layer and over the substrate in the active region, forming a gate structure on the active region of the substrate, and forming a self-aligned silicide layer on a portion of the substrate and the gate structure, wherein the final thickness of the bulk oxide layer in the protected area after these processes remains substantially the same as the first thickness. The thickness of the bulk oxide layer can be increased without any additional processing steps or any additional processing cost. The thicker bulk oxide improves the device performance by reducing the capacitance between active devices and the substrate and can also increase device to device isolation (breakdown) voltage.

BRIEF DESCRIPTION OF THE DRAWINGS

The following description can be better understood in light of the Figures, in which.

Figure 1:
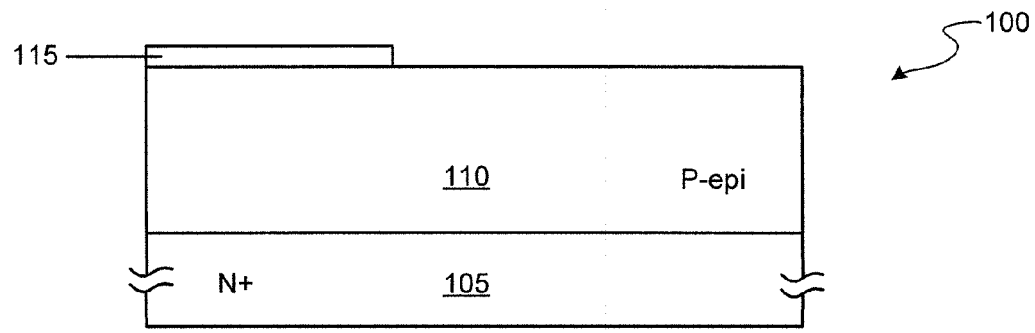
FIG. 1 shows some embodiments of a semiconductor structure containing a substrate, epitaxial layer, and a mask.

The Figures illustrate specific aspects of the semiconductor devices and methods for making such devices. Together with the following description, the Figures demonstrate and explain the principles of the methods and structures produced through these methods. In the drawings, the thickness of layers and regions are exaggerated for clarity. The same reference numerals in different drawings represent the same element, and thus their descriptions will not be repeated. As the terms on, attached to, or coupled to are used herein, one object (e.g., a material, a layer, a substrate, etc.) can be on, attached to, or coupled to another object regardless of whether the one object is directly on, attached, or coupled to the other object or there are one or more intervening objects between the one object and the other object. Also, directions (e.g., above, below, top, bottom, side, up, down, under, over, upper, lower, horizontal, vertical, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

DETAILED DESCRIPTION

The following description supplies specific details in order to provide a thorough understanding. Nevertheless, the skilled artisan would understand that the semiconductor devices and associated methods of making and using the devices can be implemented and used without employing these specific details. Indeed, the semiconductor devices and associated methods can be placed into practice by modifying the illustrated devices and methods and can be used in conjunction with any other apparatus and techniques conventionally used in the industry. For example, while the description refers to LDMOS semiconductor devices, it could be modified for any other types of semiconductor devices containing a dedicated deposited oxide layer used as drift region field plate for high voltage (HV) transistors, such as HVNMOS, HVPMOS, and/or LDPMOS devices.

Some embodiments of the semiconductor devices and methods for making such devices are illustrated in the Figures and described herein. In these embodiments, the methods can begin as depicted in FIG. 1 when a semiconductor substrate 105 is first provided as part of the semiconductor structure 100. Any semiconductor substrate can be used as the substrate 105. Examples of some substrates include single-crystal silicon wafers, epitaxial Si layers, and/or bonded wafers such as used in silicon-on-insulator (SOI) technologies. Also, any other semiconducting material typically used for electronic devices can be used as the material for the substrate 105 under the right conditions, including Ge, SiGe, GaN, C, and/or any pure or compound semiconductors, such as III-V or II-VIs and their variants. Any or all of these substrates may remain undoped or be doped with any number of p-type or n-type dopant or combination of dopants. In some configurations, the substrate 105 comprises a single-crystal Si wafer which is heavily doped with any type or number of n-type dopants to the desired concentration, as shown in FIG. 1.

The semiconductor structure 100 can optionally contain one or more epitaxial (or "epi") layers located on a portion of the upper surface of the substrate 105. In FIG. 1, the individual epitaxial layer (or multiple epitaxial layers) are depicted as epitaxial layer 110. In some configurations, the epitaxial layer 110 covers substantially the entire upper surface of substrate 105. Where Si is used as the material for the substrate 105, the epitaxial layer 110 also comprises Si. The epitaxial layer(s) 110 can be provided using any process, including any epitaxial deposition process. In some instances, the epitaxial layer(s) can be lightly doped with any type or number of p-type dopants, as shown in FIG. 1.

Figure 2:
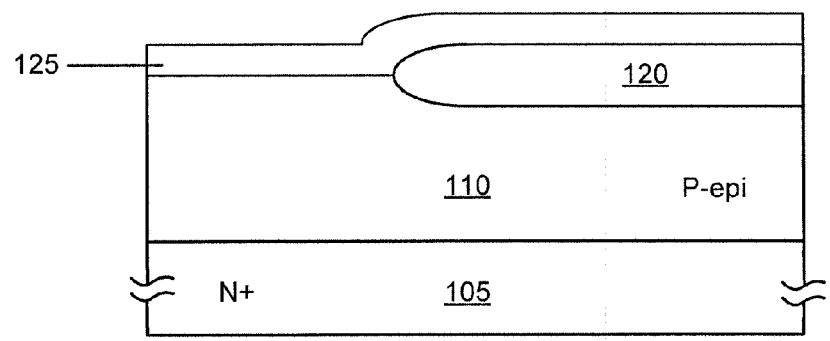
FIG. 2 shows some embodiments of a semiconductor structure containing a field oxide layer.

In the embodiments shown in FIG. 1, a mask 115 can be formed on the upper surface of the epitaxial layer 110 using any photolithography process that provides the mask 115 with the desired pattern. In some configurations, the mask comprises silicon nitride. With the mask 115 in place, the structure is subjected to a thermal oxide process so that the exposed upper Si surface of the epitaxial layer is oxidized to a bulk oxide layer. In some embodiments, the bulk oxide layer is a field oxide layer 120, as shown in FIG. 2. Any thermal oxide process can be used to grow the field oxide layer 120, including heating the structure for about 100 to about 10000 minutes at a temperature of about 900° C. to about 1250° C. in an oxide-containing atmosphere (such as $O_2$, $H_2O$, and/or $N_2O$).

The thermal oxide process can be performed until the desired thickness of the field oxide layer 120 is obtained. In some embodiments, the thickness of the field oxide layer 120 can range from about 100 to about 50000 Angstroms. In other embodiments, the thickness of the field oxide layer can range from about 1000 to about 10000 Angstroms. In yet other embodiments, the thickness of the field oxide layer can be about 3770 Angstroms. In still other embodiments, the thickness of the field oxide layer 120 can be any combination or sub-range of these amounts.

After the formation of the field oxide layer 120, the mask 115 can then be removed using any process, such as dry and wet etching, as shown in FIG. 2. Then a plate oxide layer can be blanket deposited over the resulting structure. In some configurations, the plate oxide layer is a dedicated deposited oxide layer used as drift region field plate for high voltage (HV) transistors. In some embodiments, the plate oxide layer can be a field plate oxide layer 125 (as shown in FIG. 2) since it is deposited on the field oxide layer 120. The field plate oxide layer 125 can be deposited by heating the structure in an oxygen-containing atmosphere (such as $O_2$, $H_2O$, and/or $N_2O$) for about 1 to about 500 minutes at a temperature of about 100° C. to about 1000° C. until the desired thickness (depending on the device requirements) is obtained. In some embodiments, the thickness of the field plate oxide layer 125 can range from about 100 to about 10000 Angstroms. In other embodiments, the thickness of the field plate oxide layer 125 can range from about 500 to about 5000 Angstroms. In still other embodiments, the thickness of the field plate oxide layer 125 can be any combination or sub-range of these amounts.

Figure 3:
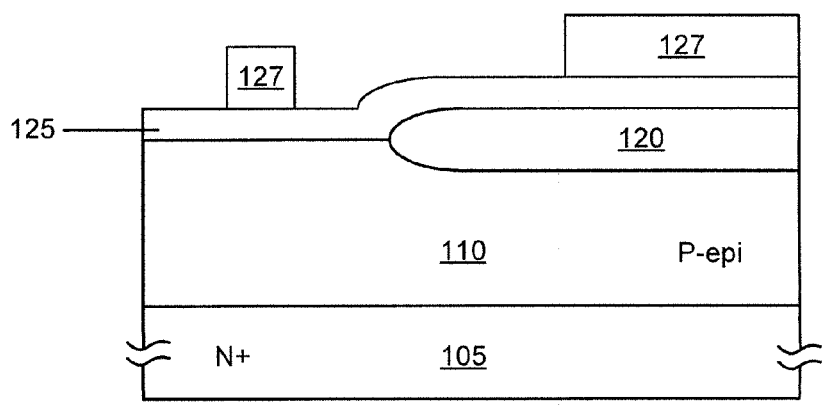
FIG. 3 shows some embodiments of a semiconductor structure containing a field plate oxide layer.
Figure 4:
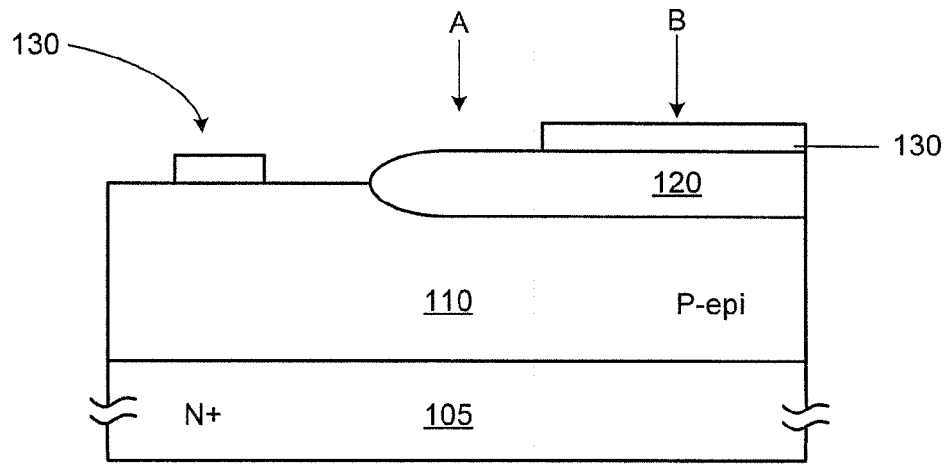
FIG. 4 shows some embodiments of a semiconductor structure containing an etched field oxide layer.

Next, as shown in FIG. 3, a second mask 127 can then be formed over the field plate oxide layer 125 using any photolithography process that provides the second mask with the desired pattern. The second mask 127 leaves portions of the field plate oxide layer 125 exposed that will be removed. An etching process can then be used to remove the exposed portions of the field plate oxide layer 125 that are not covered with the second mask 127, leaving a patterned field plate oxide layer 130 remaining over the field oxide layer 120 and over the active region of the device (where a transistor will later be formed), as shown in FIG. 4.

In some configurations, the combined thickness of the field oxide layer 120 and the patterned field plate oxide layer 130 (the first combined thickness) in the protected area B ranges from about 1000 to about 20000 Angstroms and the first combined thickness in the non-protected area A can range from about 1000 to about 20000 Angstroms. In other configurations, the first combined thickness in the protected area B ranges from about 2000 to about 10000 Angstroms and the first combined thickness in the non-protected area A can range from about 2000 to about 10000 Angstroms. In yet other configurations, the first combined thickness in the protected area B can be about 4630 Angstroms and the first combined thickness in the non-protected area A can be about 3410 Angstroms. In still other embodiments, the first combined thicknesses can be any combination or sub-range of these amounts.

Figure 5:
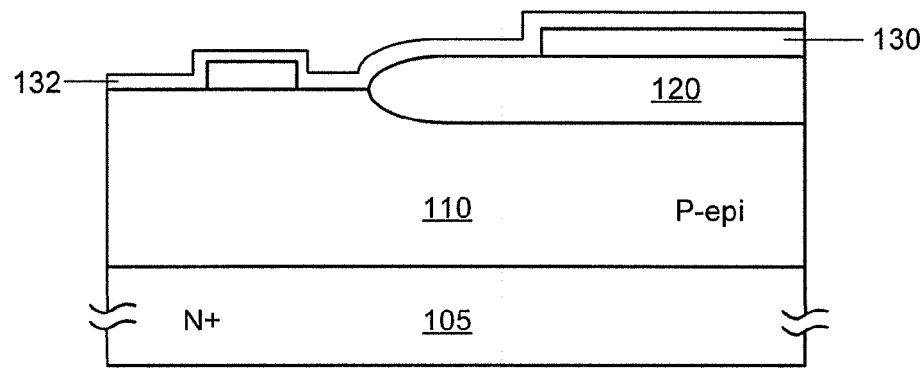
FIG. 5 shows some embodiments of a semiconductor structure containing a polysilicon gate layer.

As shown in FIG. 5, a gate insulating layer 132 is then formed on an upper surface of the epitaxial layer 110 in the active region of the structure. The gate insulating layer 132 can comprise any high-quality dielectric material, including silicon oxide. In the embodiments where the gate insulating layer is a gate oxide layer, it can be formed by using a thermal oxide process by heating in an oxygen-containing atmosphere until the desired thickness has been reached.

Figure 6:
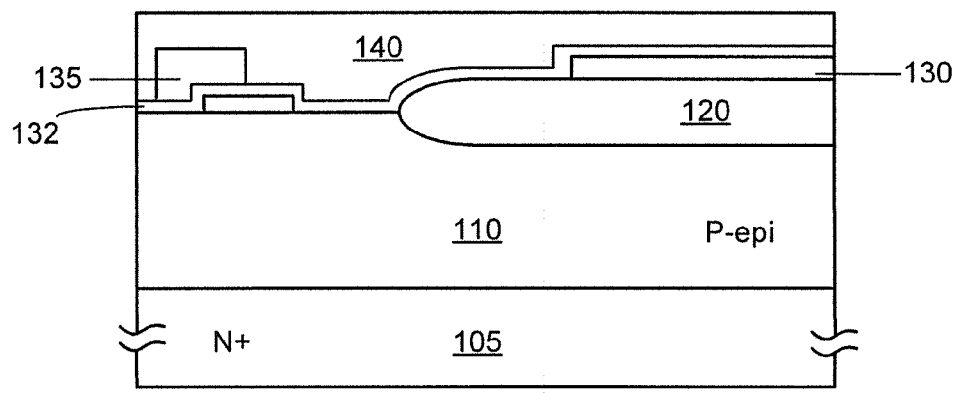
FIG. 6 shows some embodiments of a semiconductor structure containing a TEOS oxide layer.

Next, a polysilicon (or other conductive metal) gate layer 135 can then be formed over the gate insulating layer 132 and part of the patterned field plate oxide layer 130 in the active region. The polysilicon (or other conductive metal) gate 135 can then be formed by blanket depositing and then patterning a polysilicon (or other conductive metal) layer until the desired pattern is formed, as shown in FIG. 6. In some configurations, the polysilicon layer can be doped before or while it is patterned so that the resulting gate 135 contains a dopant (s) with any desired concentration.

As shown in FIG. 6, an insulating layer 140 can be formed over the resulting structure. In some embodiments, the insulating layer 140 can be formed by depositing any known insulating material (i.e., silicon oxide formed from tetraethylorthosilicate or TEOS) until it covers substantially all of the upper surface of the structure. The deposition of the insulating material can be carried out using any deposition process, including any chemical vapor deposition (CVD) process which can produce a highly conformal step coverage.

Figure 7:
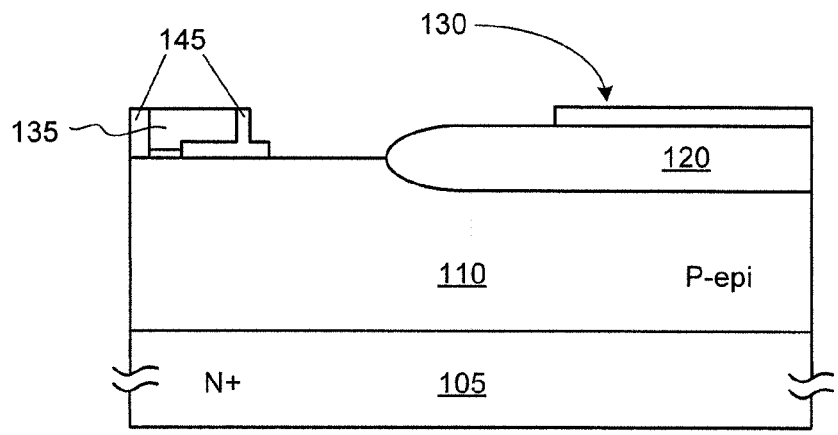
FIG. 7 shows some embodiments of a semiconductor structure containing a spacer formed on the sidewalls of the polysilicon gate layer.

Then, as shown in FIG. 7, the insulating layer 140 and insulating layer 132 can be etched back using any process so that spacers 145 remain on the sides of the polysilicon gate 135. After this etchback process, the combined thickness of the field oxide layer 120 and the patterned field plate oxide layer 130 (the second combined thickness) in the protected area B ranges from about 2000 to about 10000 Angstroms and the second combined thickness in the non-protected area A can range from about 1000 to about 9000 Angstroms. In other configurations, the second combined thickness in the protected area B ranges from about 3000 to about 8000 Angstroms and the second combined thickness in the non-protected area A can range from about 2000 to about 7000 Angstroms. In yet other configurations, the second combined thickness in the protected area B can be about 4210 Angstroms and the second combined thickness in the non-protected area A can be about 2950 Angstroms. In still other embodiments, the second combined thicknesses can be any combination or sub-range of these amounts.

Figure 8:
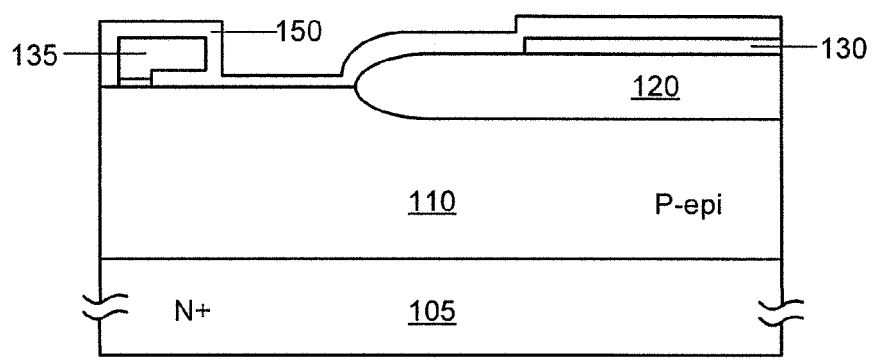
FIG. 8 shows some embodiments of a semiconductor structure containing a salicide oxide layer.

Next, a self-aligned silicide (or salicide) process is performed to reduce the source, drain, and gate resistances in the transistor in the active region of the device. In this process, a salicide oxide layer 150 can be deposited to arrive at the structure shown in FIG. 8. In some embodiments, the thickness of the salicide oxide layer 150 can range from about 100 to about 5000 Angstroms. In other embodiments, the thickness of the salicide oxide layer 150 can range from about 200 to about 2500 Angstroms. In still other embodiments, the thicknesses of the salicide oxide layer 150 can be any combination or sub-range of these amounts.

Figure 9:
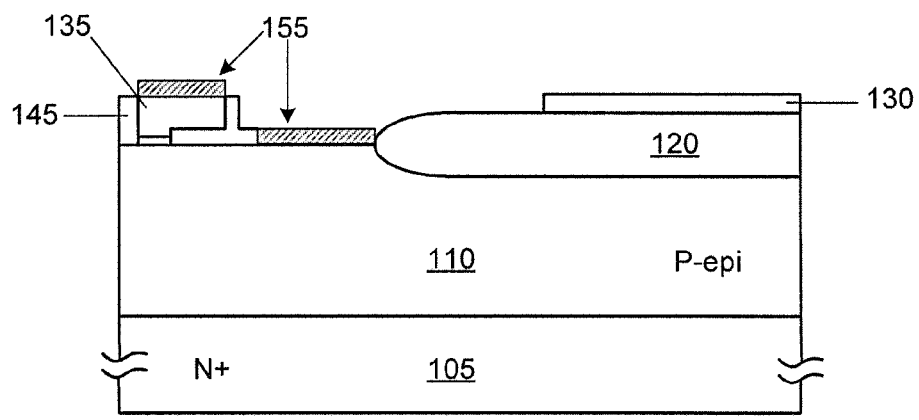
FIG. 9 shows some embodiments of a semiconductor structure containing a salicide layer and a final oxide profile.

The salicide process continues when the salicide oxide layer 150 is etched to expose portions of the epitaxial layer 110 and the polysilicon gate 135 and a silicide layer 155 is then formed on these exposed Si surfaces, as shown in FIG. 9. In this process, a mask (not shown) can be formed and used to etch away the salicide oxide layer 150 in the regions where the silicide layer 155 will be formed. After these Si surfaces are exposed, a metal (such as Co, W, Pt, Ti, or combinations thereof) layer is deposited. The metal deposition is performed at a temperature high enough so that the deposited metal and the Si react, thereby forming the silicide material of the silicide layer 155. The un-reacted potions of the metal are then removed and the salicide oxide layer 150 is then etched back. In other configurations, the salicide oxide layer 150 is not etched back provided that the oxide thickness difference between the protected area and non-protected area remains substantially the same.

After the salicide process, the final oxide profile in the protected area B of the field oxide layer 120 remains substantially the same as the thickness of the original field oxide layer 120 formed from the thermal oxidation process in some configurations. Thus, in some embodiments, the final oxide thickness in the protected area B can range from about 1000 to about 10000 Angstroms. In other embodiments, this final oxide thickness can range from about 2000 to about 8000 Angstroms. In still other embodiments, the final oxide thickness can be about 3960 Angstroms. Relative to an initial thickness of 3770 Angstroms, there is only a loss of about 80 Angstroms or a loss of only about 2%. Indeed, in other embodiments, the thickness loss can range up to about 10%. And in yet other embodiments, the thickness loss can range from about 10 to about 50%.

After the salicide process, the final oxide profile in the non-protected area A of the field oxide layer 120 remains slightly less than the thickness of the original field oxide layer 120 formed from the thermal oxidation process. Thus, in some embodiments, the final oxide thickness in the non-protected area A can range from about 100 to about 5000 Angstroms. In other embodiments, the final oxide thickness can range from about 1000 to about 4000 Angstroms. In still other embodiments, the final oxide thickness can be about 2500 Angstroms. Relative to an initial thickness of 3770 Angstroms, there is only a loss of about 1270 Angstroms or a loss of only about 34%. Indeed, in other embodiments, the thickness loss can range up to about 50%. And in yet other embodiments, the thickness loss can range from about 50 to about 100%.

Figure 10:
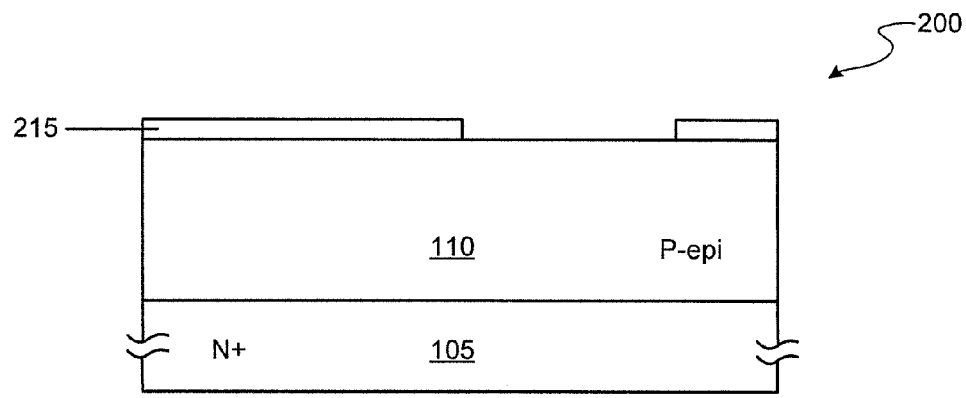
FIG. 10 shows some embodiments of a semiconductor structure containing a substrate, epitaxial layer, and a mask.
Figure 11:
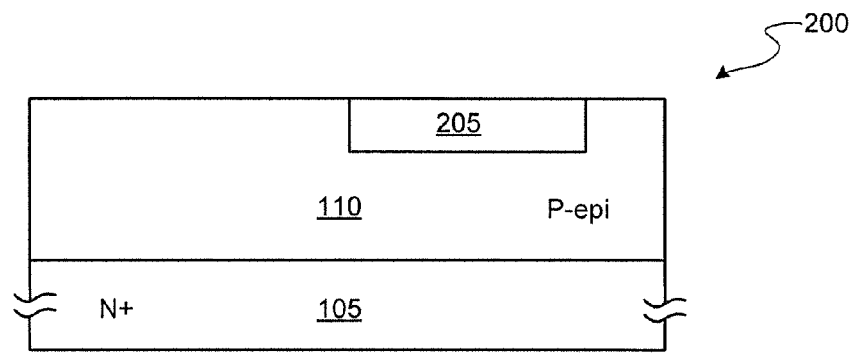
FIG. 11 shows some embodiments of a semiconductor structure containing a shallow trench containing a field oxide layer.
Figure 12:
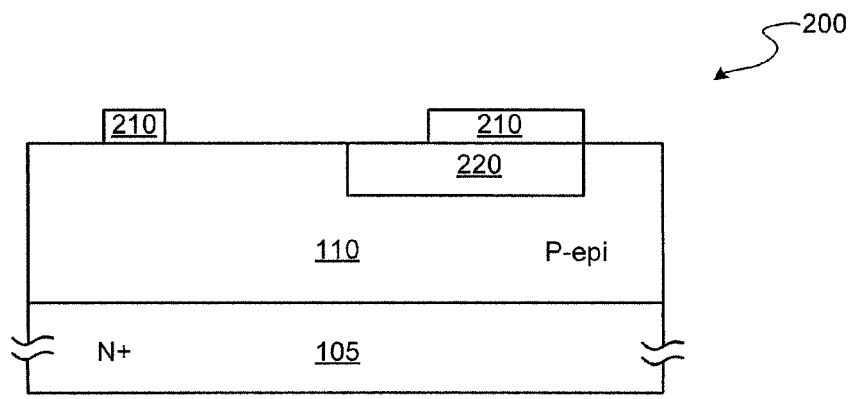
FIG. 12 shows some embodiments of a semiconductor structure containing a field plate oxide layer.

In other embodiments, the process described herein can be used in a shallow trench isolation process instead of a field oxide isolation process. In these embodiments, as shown in FIGS. 10-12, a semiconductor structure 200 can be formed with a substrate 105, epitaxial layer 110, and with a mask 215 that is substantially similar to mask 115 but configured slightly different. Next, as shown in FIG. 11, a shallow trench structure (or trench) 205 can be formed in the epitaxial layer 110. The trench 205 can be formed by any process, including etching the epitaxial layer 110 through the mask 215 using any etchant that will etch the material of the epitaxial layer 110. After the trench 205 has been created, the mask 215 can then be removed. Then, an oxide material can be formed in the trench 205, forming a bulk oxide layer (or shallow trench oxide layer 220). A plate oxide layer 210 (substantially similar to the plate oxide layer 130) can be formed over the oxide layer 220. The structure can then be processed substantially similar to the device containing the field oxide layer described above.

Whether the semiconductor device contains a field oxide isolation or shallow trench isolation as described above, additional processing can be performed to complete the semiconductor device. This additional processing includes forming source and drain regions, connecting them to source and drain contacts, packaging the devices, separating them from the wafers in which they are formed by sawing along scribe lines that have been formed in the wafer. The packages devices can then be connected to a printed circuit board (PCB) and used in any electronic device such as portable computers, disk drives, USB controllers, portable audio devices, or any other portable electronic devices.

These methods and the semiconductor structures formed during these methods exhibit several interesting features. First, the structures contain a thick field (or bulk) oxide layer. Increasing the field oxide thickness can be important because thicker field oxide improves integrated circuit (IC) performance by reducing the capacitance between the active devices and the substrate, as well as increasing the device to device isolation (breakdown) voltage. Such increased thickness was difficult to obtain in some conventional devices because the thickness was limited by process thermal budget, encroachment, and stress. After deposition, the field oxide layer was subjected to several subsequent oxide etch steps (spacer etch back, salicide definition etch back, dual gate oxide etch, etc.) that can reduce that thickness. But the methods described herein can increase the field oxide thickness and can protect the field oxide from these later etch steps which might have otherwise removed about 1000 to about 3000 Angstroms.

Second, this increased thickness can be achieved without any additional processing steps or any additional processing cost. The methods described herein have a dedicated deposited oxide that is used as a drift region field plate for HV transistors (LNDMOS, HVNMOS, and HVPMOS). This plate oxide can be deposited over substantially over the entire wafer and selectively removed by a photolithography and etch sequence. By not removing this plate oxide layer, the underlying field oxide layer can not only be protected from subsequent oxide etch steps, but can also be increased in thickness.

It is understood that all material types provided herein are for illustrative purposes only. Accordingly, while specific dopants are names for the n-type and p-type dopants, any other known n-type and p-type dopants (or combination of such dopants) can be used in the semiconductor devices. As well, although the devices of the invention are described with reference to a particular type of conductivity (P or N), the devices can be configured with a combination of the same type of dopant or can be configured with the opposite type of conductivity (N or P, respectively) by appropriate modifications.

This application also relates to semiconductor devices made by the method of providing a semiconductor substrate with an active region, providing a bulk oxide layer in a non-active portion of the substrate, the bulk oxide layer having a first thickness in a protected area of the device, providing a plate oxide layer over the bulk oxide layer and over the substrate in the active region, forming a gate structure on the active region of the substrate, and forming a self-aligned silicide layer on a portion of the substrate and the gate structure, wherein the final thickness of the bulk oxide layer in the protected area after these processes remains substantially the same as the first thickness In addition to any previously indicated modification, numerous other variations and alternative arrangements may be devised by those skilled in the art without departing from the spirit and scope of this description, and appended claims are intended to cover such modifications and arrangements. Thus, while the information has been described above with particularity and detail in connection with what is presently deemed to be the most practical and preferred aspects, it will be apparent to those of ordinary skill in the art that numerous modifications, including, but not limited to, form, function, manner of operation and use may be made without departing from the principles and concepts set forth herein. Also, as used herein, examples are meant to be illustrative only and should not be construed to be limiting in any manner.

The invention claimed is:

1. A method for making a semiconductor device, comprising:
    providing a semiconductor substrate with an active region;
    providing a bulk oxide layer in a non-active portion of the substrate, the bulk oxide layer having a first thickness in a protected area of the device;
    providing a plate oxide layer on the bulk oxide layer and over the substrate in the active region;
    then forming a gate structure in the active region of the substrate; and
    forming a self-aligned silicide layer on a portion of the substrate and the gate structure;
    wherein the difference between the first thickness and the final thickness of the bulk oxide layer and the plate oxide layer is less than about 10%.

2. The method of claim 1, wherein the bulk oxide layer comprises a field oxide layer formed by a thermal oxidation process.

3. The method of claim 1, wherein the first thickness ranges from about 1000 to about 20000 angstroms.

4. The method of claim 3, wherein the first thickness ranges from about 2000 to about 10000 angstroms.

5. The method of claim 1, wherein the final thickness ranges from about 1000 to about 10000 angstroms.

6. The method of claim 5, wherein the final thickness ranges from about 2000 to about 8000 angstroms.

7. The method of claim 1, wherein the difference between the first thickness and the final thickness ranges is less than about 2%.

8. The method of claim 1, wherein the final thickness in the protected area after these processes remains substantially the same as the first thickness.

9. The method of claim 1, further comprising providing the plate oxide layer by blanket depositing an oxide material and then etching the oxide material using a mask to leave the oxide material over the bulk oxide layer and over the substrate in the active region.

10. A method for making a LDMOS semiconductor device, comprising:
    providing a semiconductor substrate with an active region;
    providing a bulk oxide layer in a non-active portion of the substrate, the bulk oxide layer having a first thickness in a protected area of the device;
    providing a plate oxide layer on the bulk oxide layer and over the substrate in the active region;
    then forming a gate structure on the active region of the substrate; and
    forming a self-aligned silicide layer on a portion of the substrate and the gate structure;
    wherein the final thickness of the bulk oxide layer and the plate oxide layer in the protected area after these processes remains substantially the same as the first thickness.

11. The method of claim 10, wherein the bulk oxide layer comprises a field oxide layer formed by a thermal oxidation process.

12. The method of claim 10, wherein the first thickness ranges from about 1000 to about 20000 angstroms.

13. The method of claim 12, wherein the first thickness ranges from about 2000 to about 10000 angstroms.

14. The method of claim 10, wherein the final thickness ranges from about 1000 to about 10000 angstroms.

15. The method of claim 14, wherein the final thickness ranges from about 2000 to about 8000 angstroms.

16. The method of claim 10, wherein the difference between the first thickness and the final thickness is less than about 2%.

17. The method of claim 10, wherein the final thickness in the protected area after these processes remains substantially the same as the first thickness.

18. The method of claim 10, further comprising providing the plate oxide layer by blanket depositing an oxide material and then etching the oxide material using a mask to leave the oxide material over the bulk oxide layer and over the substrate in the active region.

19. A method for making a semiconductor device, comprising:
    providing a semiconductor substrate with an active region;

providing a bulk oxide layer in a non-active portion of the substrate, the bulk oxide layer having a first thickness in a protected area of the device;

providing a plate oxide layer on the bulk oxide layer and over the substrate in the active region;

then forming a gate structure in the active region of the substrate; and forming a self-aligned silicide layer on a portion of the substrate and the gate structure;

wherein the difference between the first thickness and the final thickness of the bulk oxide layer and the plate oxide layer is less than about 2%.

20. The method of claim 1, wherein the difference between the first thickness and the final thickness is about 80 angstroms.

* * * * *